United States Patent [19]
Iwasa et al.

[11] Patent Number: 5,572,659
[45] Date of Patent: Nov. 5, 1996

[54] ADAPTER FOR CONSTRUCTING A REDUNDANT DISK STORAGE SYSTEM

[75] Inventors: Hiroyuki Iwasa, Fujisawa; Hideo Asano, Machida; Yutaka Shimizu, Fujisawa, all of Japan

[73] Assignee: International Business Machines Corporation, Armonk, N.Y.

[21] Appl. No.: 405,624

[22] Filed: Mar. 16, 1995

Related U.S. Application Data

[63] Continuation of Ser. No. 58,703, May 7, 1993, abandoned.

[30] Foreign Application Priority Data

May 12, 1992 [JP] Japan ................................. 4-119226

[51] Int. Cl.$^6$ ........................................................ G06F 11/34
[52] U.S. Cl. ............................... 395/182.04; 395/185.07
[58] Field of Search .................................... 371/8.1, 10.1, 371/11.1; 364/238.4, 238.5; 395/575, 180, 181, 182.01, 182.03, 182.04, 182.05, 184.01, 185.01, 185.07

[56] References Cited

U.S. PATENT DOCUMENTS

| | | | |
|---|---|---|---|
| 3,544,777 | 12/1970 | Winkler . | |
| 5,159,671 | 10/1992 | Iwami | 364/268.5 |
| 5,206,939 | 4/1993 | Yamai et al. | 364/200 |
| 5,212,784 | 5/1993 | Sparks | 395/575 |
| 5,239,640 | 8/1993 | Froemke et al. | 371/11.1 |
| 5,239,650 | 8/1993 | Hartung et al. | 364/200 |
| 5,258,984 | 11/1993 | Menon et al. | 371/10.1 |
| 5,265,252 | 11/1993 | Rawson, III et al. | 364/200 |
| 5,271,012 | 12/1993 | Blaum et al. | 371/10.1 |
| 5,274,799 | 12/1993 | Brant et al. | 395/575 |
| 5,278,838 | 1/1994 | Ng et al. | 371/10.1 |
| 5,283,790 | 2/1994 | Kawashita | 371/10.1 |
| 5,289,589 | 2/1994 | Bingham et al. | 375/425 |
| 5,301,310 | 4/1994 | Isman et al. | 395/575 |
| 5,303,244 | 4/1994 | Watson | 371/10.1 |
| 5,305,326 | 4/1994 | Solomon et al. | 371/11.1 |
| 5,313,612 | 5/1994 | Satoh et al. | 395/575 |
| 5,331,646 | 7/1994 | Krueger et al. | 371/40.1 |
| 5,333,277 | 7/1994 | Searls | 395/325 |

FOREIGN PATENT DOCUMENTS

| | | | |
|---|---|---|---|
| 0279912 | 8/1988 | European Pat. Off. . | |
| 0426185 | 5/1991 | European Pat. Off. . | |
| 61-240320 | 10/1986 | Japan | G06F 3/06 |
| 61-249132 | 11/1986 | Japan | G06F 3/06 |
| 62-139172 | 6/1987 | Japan | G11B 19/02 |

OTHER PUBLICATIONS

IBM Technical Disclosure Bulletin, vol. 33, No. 1A, Jun. 1990, "Direct and Indirect Addressing of Peripheral Devices", pp. 475–477.

Electronic Design, Mar. 14, 1991, D. Bursky, "Build SCSI Raid Systems to Boost Data Availability", pp. 35–41.

*Primary Examiner*—Robert W. Beausoliel, Jr.
*Assistant Examiner*—Albert Decady
*Attorney, Agent, or Firm*—Roy W. Truelson; Richard E. Billion; Karuna Ojanen

[57] ABSTRACT

An adapter connected between a host computer and disk storage devices provides interfaces for connecting to the host computer and the disk storage devices having the same interface design. The adapter itself includes control means for building a redundant disk storage system. Moreover, the adapter itself includes means for detecting and indicating a failed disk storage device, means for replacing the failed disk storage device, and means for rebuilding a redundant disk storage system after the replacement of disk storage devices. A command is configured so that the host computer can have access to each of disk storage devices for maintenance purposes. The adapter makes it easy to configure a highly reliable redundant disk storage system for a small computer system without any change to existing hardware or software.

7 Claims, 18 Drawing Sheets

BLOCK DIAGRAM SHOWING WHOLE CONFIGURATION

BLOCK DIAGRAM SHOWING WHOLE CONFIGURATION

Data Flows in Adapter During Writing Operation

Flowchart Showing Operations in
Adapter During Writing Operation

Data Flows in Adapter During Reading Operation

Flow of Write Data in the Case of Failure in Primary DASD

Flow of Write Data in the Case of Failure in Secondary DASD

Flow of Read Data in the Case of Failure in Primary DASD

Flow of Read Data in the Case of Failure in Secondary DASD

Data Flows Between Primary and Secondary DASDs

| LED name | LED state | Meaning |
|---|---|---|
| Primary and secondary SCSI DASDs (801) | on | Corresponding one of DASDs 107 and 108 available |
| | off | Corresponding one of DASDs 107 and 108 does not exist or not available |
| | Blinks | Corresponding one of DASDs 107 and 108 in failure |
| | Comes on every two minutes | Corresponding one of DASDs 107 and 108 formatting |
| Mode selection (803) | on | Maintenance mode |
| | off | Operating mode of usual redundant DASD system |
| | Blinks | Power on self test error |
| DASD replacement (805) | on | DASD replaceable |
| | off | DASD connecting online to host |
| | Blinks | Acknowledgement for request to replace |

Indication States of LED and Their Meaning

FIG. 14

| CODE (hexadecimal) | S C S I Commands | |
|---|---|---|
| 00h | Test Unit Ready | |
| 01h | Rezero Unit | |
| 02h | Maintenance Switch | C |
| 03h | Request Sense | |
| 04h | Format Unit | |
| 07h | Reassign Block | |
| 08h | Read Out | A |
| 0Ah | Write | B |
| 0Bh | Seek | |
| 12h | Inquiry | |
| 15h | Mode Select | |
| 16h | Reserve | |
| 17h | Release | |
| 1Ah | Mode Sense | |
| 1Bh | Start/Stop Unit | |
| 1Dh | Send Diagnostic | |
| 25h | Read Capacity | |
| 28h | Read Out | A |
| 2Ah | Write | B |
| 2Bh | Seek | |
| 2Eh | Write and Verify | B |
| 2Fh | Verify | |
| 3Bh | Data Buffer Write | |
| 3Ch | Data Buffer Read | |
| 3Eh | Read Out Long | A |
| 3Fh | Write Long | B |

SCSI Commands

FIG. 15

|  | 7 | 6 | 5 | 4 | 3 | 2 | 1 | 0 |
|---|---|---|---|---|---|---|---|---|
| Byte 0 | Command code = 02h ||||||||
| Byte 1 | MA_MODE |||| 0 | 0 | 0 | XFER |
| Byte 2 | 0 ||||||||
| Byte 3 | 0 ||||||||
| Byte 4 | ALLOCATION LENGTH ||||||||
| Byte 5 | UV = 0 |||||| 0 | FLAG | LINK |

Maintenance Switch Command

FIG. 16

| Mode Selector Switch -OFF | XFER-0 | MA_MODE-x00b |
|---|---|---|
| Logical unit number | Primary DASD SCSI ID | Secondary DASD SCSI ID |
| 0 | 6 | 6 |
| 1 | 5 | 5 |
| 2 | 4 | 4 |
| 3 | 3 | 3 |
| 4 | 2 | 2 |
| 5 | 1 | 1 |
| 6 | 0 | 0 |

The Configuration of DASDs During Execution of Redundant DASD System Function

FIG. 17

| Mode Selector Switch -ON | XFER-0 | MA_MODE-x01b |
|---|---|---|
| Logical unit number | Primary DASD SCSI ID | Secondary DASD SCSI ID |
| 0 | 6 | N/A |
| 1 | N/A | 6 |
| 2 | 5 | N/A |
| 3 | N/A | 5 |
| 4 | 4 | N/A |
| 5 | N/A | 4 |

The Configuration of DASDs in Maintenance Mode

FIG. 18

| Mode Selector Switch | -ON XFER-0 | MA_MODE-x10b |
|---|---|---|
| Logical unit number | Primary DASD SCSI ID | Secondary DASD SCSI ID |
| 0 | 3 | N/A |
| 1 | N/A | 3 |
| 2 | 2 | N/A |
| 3 | N/A | 2 |
| 4 | 1 | N/A |
| 5 | N/A | 1 |

The Configuration of DASDs in Maintenance Mode

FIG. 19

| Mode Selector Switch | -ON XFER-0 | MA_MODE-x11b |
|---|---|---|
| Logical unit number | Primary DASD SCSI ID | Secondary DASD SCSI ID |
| 0 | 0 | N/A |
| 1 | N/A | 0 |

The Configuration of DASDs in Maintenance Mode

FIG. 20

ADAPTER FOR CONSTRUCTING A REDUNDANT DISK STORAGE SYSTEM

This application is a continuation of application Ser. No. 08/058,703, filed May 7, 1993, now abandoned.

FIELD OF THE INVENTION

The present invention relates to an adapter for connecting disk storage devices to a host computer, and more particularly to an adapter which builds up a redundant and backup disk storage system and can be connected, through interfaces each having the same interface design, to a host computer and each of the disk storage devices.

BACKGROUND OF THE INVENTION

A disk storage device is an indispensable device for storing mass data and programs of a computer system. In case of a failure in a disk storage device, data or a program may be prevented from being read out from or stored into the disk storage device and the entire computer system using the disk storage device may stop. The disk storage device having movable mechanical parts, it is comparatively easy to fail in the computer system. To prepare for failure, it is conventionally known that dual disk storage devices are redundantly constructed so as to have two disk storage devices each of which always stores the same data and programs, and in the event of failure in one disk storage device, the other normal disk storage device replaces the failed device. Such a redundant or backup system is indispensable to applications which need high reliability, for example, financial applications in banks, securities corporations, etc.

For example, Japanese Published Unexamined Patent Applications (PUPAs) No. 61-240320, No. 61-249132, and No. 62-139172 disclose redundant or backup disk controllers having dual construction. Disclosed in the above PUPAs are disk controllers connected between a large central processing unit and disk storage devices, especially designed so that the same data can be stored in each of two disk storage devices to prepare for failure. However, in a large system, the central processing unit is connected to the disk storage devices through the disk controller. In this case, a host interface for connecting the disk controller to the central processing unit is different from a device interface for connecting the disk controller to the disk storage devices. That is, the host interface, called a channel, can transfer data at a high rate, but is not specialized in a certain peripheral unit. On the other hand, since the disk controller controls a certain disk storage device, the device interface between them is specialized in characteristics peculiar to the disk storage device. That is, the prior art does not suggest the construction of an adapter between a host and redundant disk storage devices, in which a host and device interfaces have the same interface design.

In the process of downsizing in new information processing equipment, it is desired to prepare for failure in disk storage devices used for a small computer (personal computer, workstation, etc.) by making redundant construction for them in applications requiring high reliability. In this case, it is advantageous that a system prepared for failure can be built without making alterations to both host computer and disk storage devices by using standard interfaces for the small computer, for the reason that the system prepared for failure can be constructed with a standard computer and disk storage devices which can be easily purchased. Further, if redundant construction is transparent to a host computer, an operating system or application programs on the host computer can handle the redundant or backup disk storage devices prepared for failure the same as in a single disk storage device. This enables an operating system or application programs used hitherto to perform highly reliable information processing. Such an interface is, for example, an SCSI (Small Computer System Interface, ANSI X3.131-1986 by the American National Standards Institute (ANSI)).

SUMMARY OF THE INVENTION

An adapter which connects disk storage devices to a host computer for building a redundant disk storage system according to the present invention, connects between the host computer and a pair of the disk storage devices by using the same interface, for example, SCSI, writes the same data to each of the paired disk storage devices for a writing operation, and reads out data from one of the paired disk storage devices for a reading operation. Further, the adapter includes control means for, when one of the paired disk storage devices fails, detaching the failed one from the sound one and performing a reading or writing operation for the other sound one of the paired disk storage devices.

To explain in detail, the adapter for connecting disk storage devices to a host computer, according to the present invention, includes a host interface for connecting to the host computer, a primary device interface and a secondary device interface, each having the same interface design as the host interface. Connected to the primary and secondary device interfaces are primary disk storage devices (called active storage devices) and secondary disk storage devices (called backup storage devices) paired with the primary disk storage devices, respectively.

During a writing operation to the disk storage devices by the host computer, the same data is stored in both of the primary and secondary disk storage devices. Therefore, the primary and secondary disk storage devices each always retain the same data. During a reading operation from the disk storage devices by the host computer, data read out from the primary disk storage device is transferred to the host computer. If either the primary or secondary disk storage device fails, the reading and writing operations are performed for a sound disk storage device. Then if a failed disk storage device is replaced or one of the disk storage devices loses partial data, data read from the sound disk storage device is copied to a new disk storage device or the disk storage device from which the data is lost.

The above operation is performed without any intervention of the host computer or without interrupting data transfer. That is, the operation is transparent to the host computer. The host computer performs the reading or writing operation only for a single disk storage device. The adapter according to the present invention automatically makes a writing operation redundant or switches a failed device to a sound device. Therefore, on the side of the host computer, any change to software or hardware is not needed, and on the disk storage devices a redundant or backup system prepared for failure in them can be constructed without any change if an interface can be connected thereto. Further, the adapter for a redundant or backup disk storage system according to the present invention includes means for detecting and indicating failure in the disk storage devices independently of the host computer and means for replacing a failed disk storage device with a new one and rebuilding the new one into the backup system by using a sound disk storage device of a pair of disk storage devices without stopping the running of the host computer. Still further, the adapter for a redundant or backup disk storage system according to the present invention includes means that enable the host computer to have separate access to each of the pair of primary and secondary disk storage devices by using a command from the host computer.

BRIEF DESCRIPTION OF THE DRAWINGS

FIG. 14 is a table showing the states and meaning of light emitting diodes on the panel for the adapter for the redundant DASDs of the embodiment;

FIG. 15 is a table showing the commands (and their types) of SCSI interface for the adapter for the redundant DASDs of the embodiment;

FIG. 16 is a diagram showing the configuration of a maintenance switch command for the adapter for the redundant DASDs of the embodiment;

FIG. 17 is a diagram showing the assignment of logical unit numbers to the primary and secondary DASDs in the usual operating mode of the adapter for the redundant DASDs of the embodiment;

FIG. 18 is a diagram showing the assignment of logical unit numbers to the primary and secondary DASDs in the maintenance mode of the adapter for the redundant DASDs of the embodiment;

FIG. 19 is a diagram showing the assignment of logical unit numbers to the primary and secondary DASDs in the maintenance mode of the adapter for the redundant DASDs of the embodiment;

FIG. 20 is a diagram showing the assignment of logical unit numbers to the primary and secondary DASDs in the maintenance mode of the adapter for the redundant DASDs of the embodiment.

DETAILED DESCRIPTION OF THE PREFERRED EMBODIMENT

In the following, an embodiment of the present invention is described by reference to the drawings.

Figure 1:
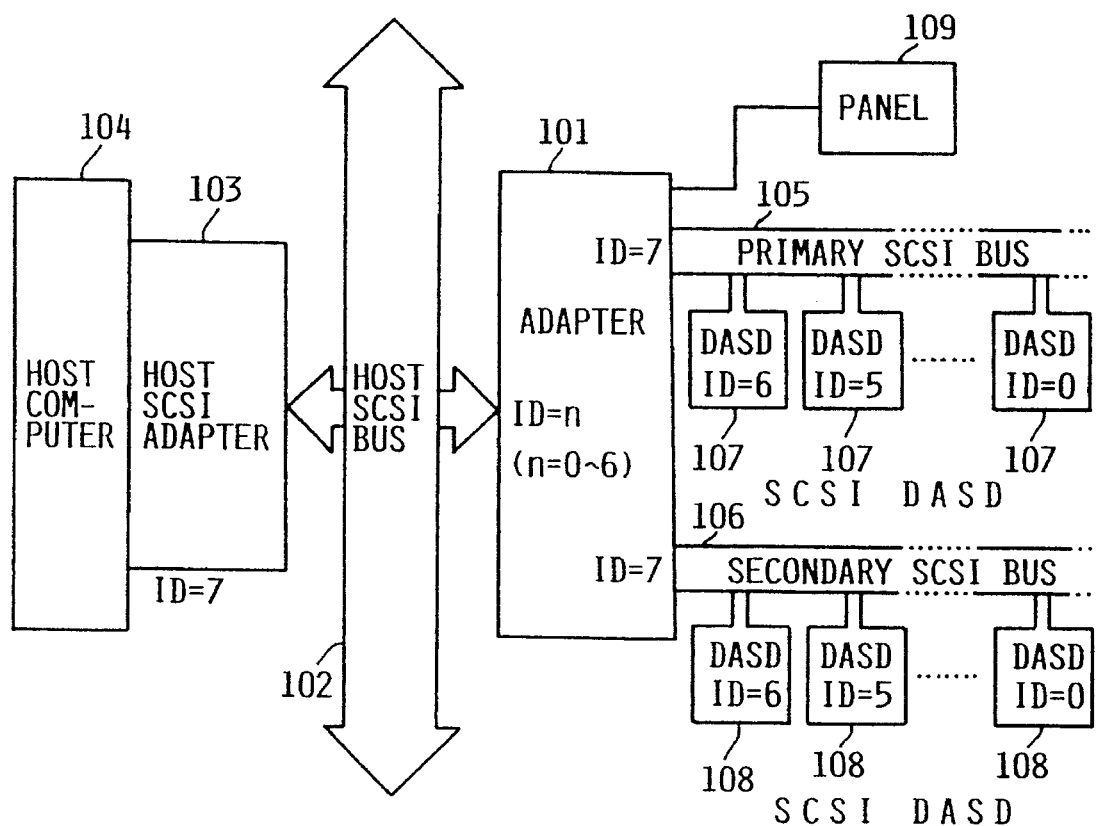
FIG. 1 is a block diagram showing the whole configuration of a computer system including an adapter for redundant DASDs according to an embodiment of the present invention.

FIG. 1 is a block diagram showing an entire computer system into which redundant or backup disk storage devices are built through an adapter according to an embodiment of the present invention. Indicated by 101 is the adapter according to the embodiment for connecting the disk storage devices to a host computer. Adapter 101 communicates, through host SCSI bus 102, with host SCSI adapter 103. Host SCSI adapter 103 is connected to an unillustrated system bus within host computer 104. On host SCSI bus 102, host SCSI adapter and the adapter are assigned a maximum ID (identification code)=7 and ID=n (where n is an integer 0 to 6), respectively. On host SCSI bus 102, up to a maximum of six SCSI devices having SCSI interfaces with IDs 0 to 6 other than n can be assigned.

Figure 2:
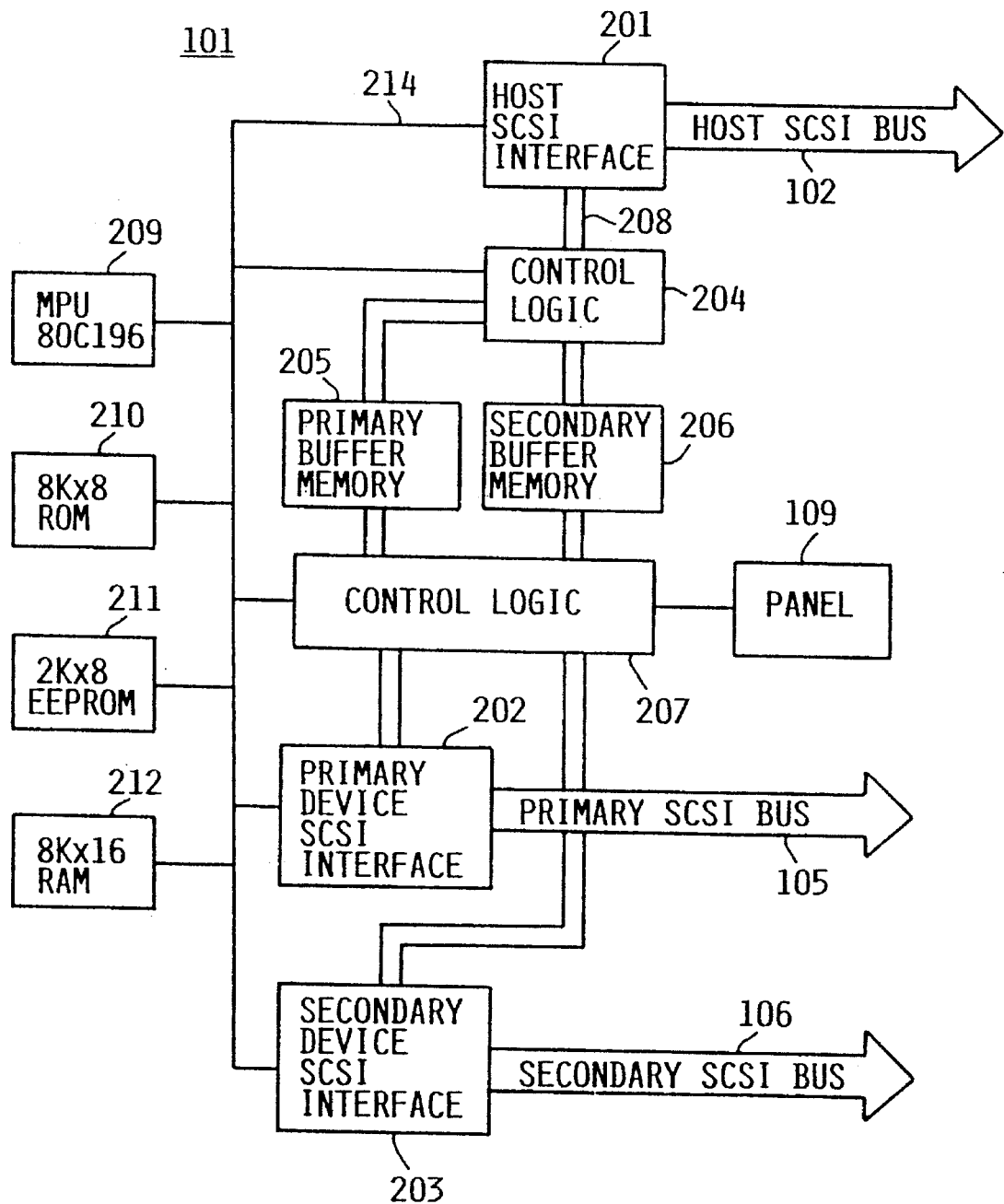
FIG. 2 is a block diagram showing the adapter for the redundant DASDs of the embodiment.

FIG. 2 is a block diagram showing adapter 101. Adapter 101 has host SCSI interface 201 which connects to host SCSI bus 102. Adapter 101 includes primary device SCSI interface 202, which is connected to primary SCSI bus 105, and secondary device SCSI interface 203, which is connected to secondary SCSI bus 106, each having the same interface as host SCSI interface 201. Primary device SCSI interface 202 and secondary device SCSI interface 203 operate only in an initiator mode which issues a command, while host SCSI interface 201 operates only in a target mode which receives a command.

Primary and secondary SCSI buses 105 and 106 shown in FIG. 1 can connect to up to seven SCSI disk storage devices (DASD) 107 and 108 having the same SCSI interface design, respectively. Disk storage devices (DASDs) 107 connected to primary SCSI bus 105 are called primary disk storage devices, while disk storage devices (DASDs) 108 connected to secondary SCSI bus 106 are called secondary disk storage devices.

Adapter 101 has a maximum ID (=7) in the SCSI interfaces on the primary and secondary SCSI buses 105 and 106 and primary and secondary DASDs 107 and 108 have IDs from 0 to 6 for the SCSI interfaces. On the same SCSI bus, devices cannot have the same ID. Primary and secondary DASDs 107 and 108 which are connected to primary and secondary SCSI buses 105 and 106, respectively, and have the same ID, are paired with each other and always retain the same data so that they can be complementary to each other, as is obvious from the following description. DASDs 107 and 108 may be either magnetic disk storage devices or optical disk storage devices.

As shown in FIG. 2, host SCSI interface 201 of adapter 101, connected to host SCSI bus 102, is connected to primary buffer memory 205 and secondary buffer memory 206. Buffer memories 205 and 206 each have a storage capacity of 32 Kbytes. Primary and secondary buffer memories 205 and 206 are connected to primary and secondary device SCSI interfaces 202 and 203, respectively. In FIG. 2, data paths 208 in adapter 101 are indicated by thick lines. Adapter 101 includes panel 109 for indicating operation status, which is connected, through control logic 204, microprocessor MPU 209, read-only memory ROM 210, rewritable read-only memory EEPROM 211, volatile random-access memory RAM 212, and control logic 207, to MPU 209. These are connected through local bus 214. Stored in nonvolatile ROM 210 and EEPROM 211 are a program and parameters required for controlling functions to be performed by adapter 101.

Figure 3:
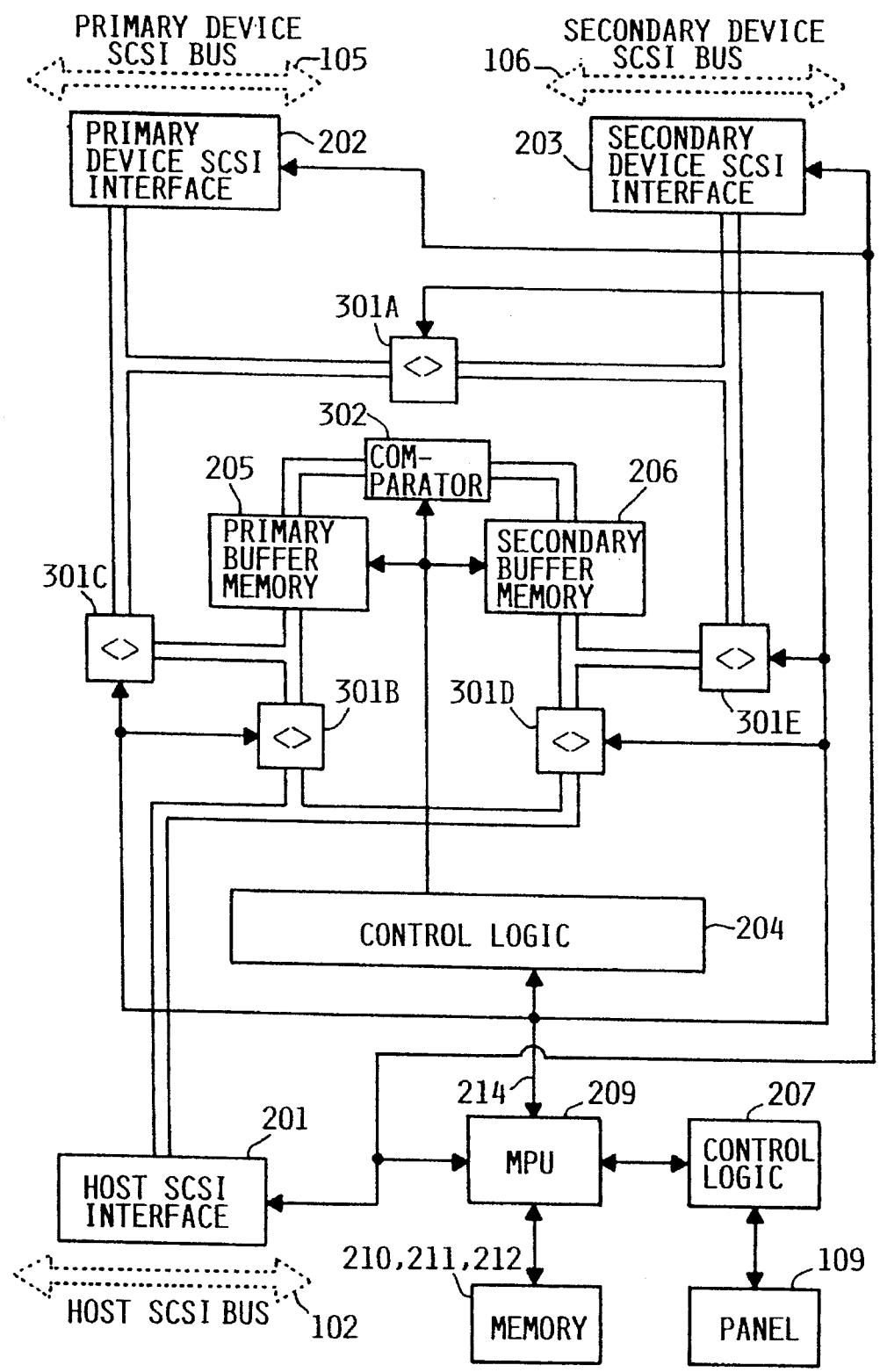
FIG. 3 is a block diagram showing a flow of data and control in the adapter for the redundant DASDs of the embodiment.

FIG. 3 is a block diagram showing the flow of data and control information in adapter 101 of the embodiment. Indicated by 301A, B, . . . E are bilateral gates which control data flow by control information from control logic 204 and microprocessor 209. Gate 301A is used to control data transfer between a pair of primary DASD 107 and secondary DASD 108. Gates 301B and 301C are used to control data transfer between host SCSI interface 201 and primary buffer memory 205, and data transfer between primary DASDs 107 and primary buffer memory 205, respectively. Gates 301D and 301E are used to control data transfer between host SCSI interface 201 and secondary buffer memory 206, and data transfer between secondary DASDs 107 and secondary buffer memory 206, respectively.

Adapter 101 of the embodiment can detect a failure in any of a pair of primary and secondary DASDs 107 and 108. Failure can be detected based on signals such as drive not ready, etc. from primary or secondary DASD 107 or 108 that indicate abnormality or default, or the status information of a SCSI command. Adapter 101 includes comparator 302 in which data to be transferred to primary and secondary buffer memories 205 and 206 from primary and secondary DASDs 107 and 108 during a reading operation or the status information of a SCSI command to be responded to and transferred to primary and secondary buffer memories 205 and 206 from primary and secondary DASDs 107 and 108 is compared, and from which error information is transferred, when disaccord occurs, to host computer 104 or panel 109.

Figure 4:
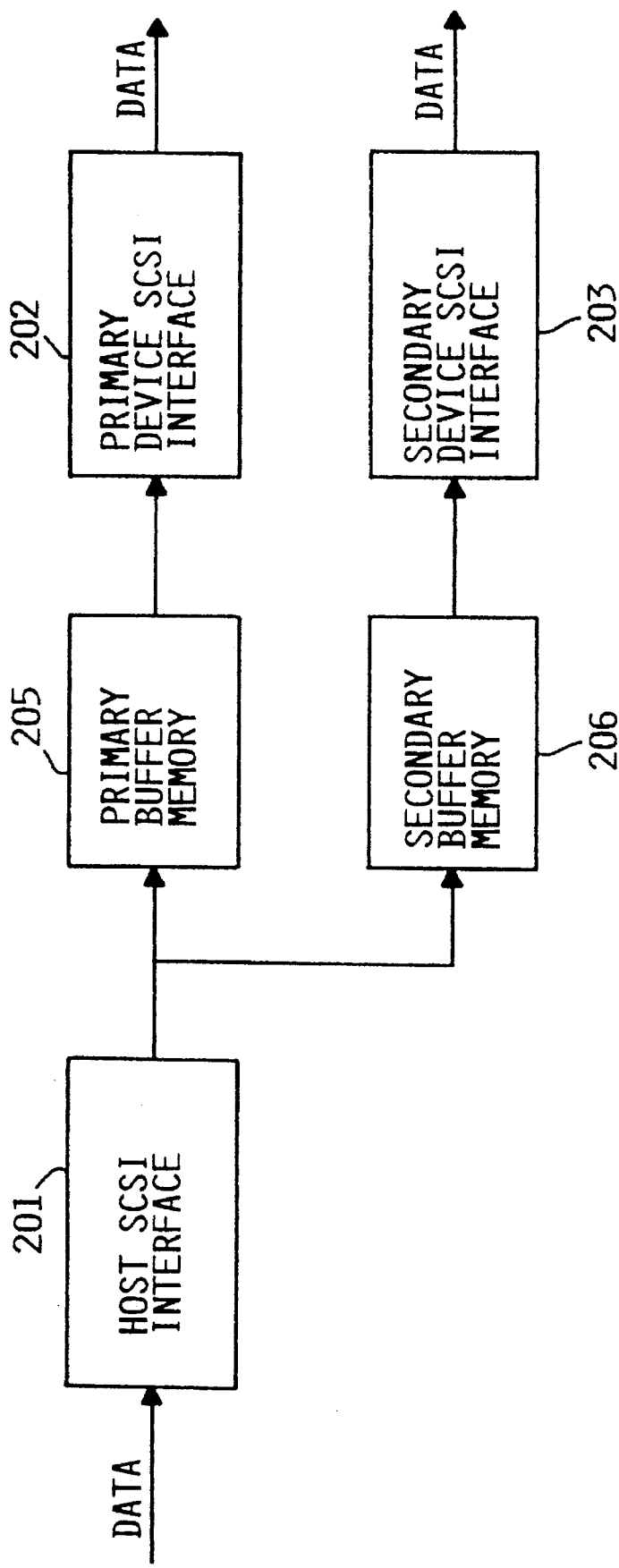
FIG. 4 is a block diagram showing data flow in the adapter for the redundant DASDs of the embodiment during a writing operation.
Figure 5:
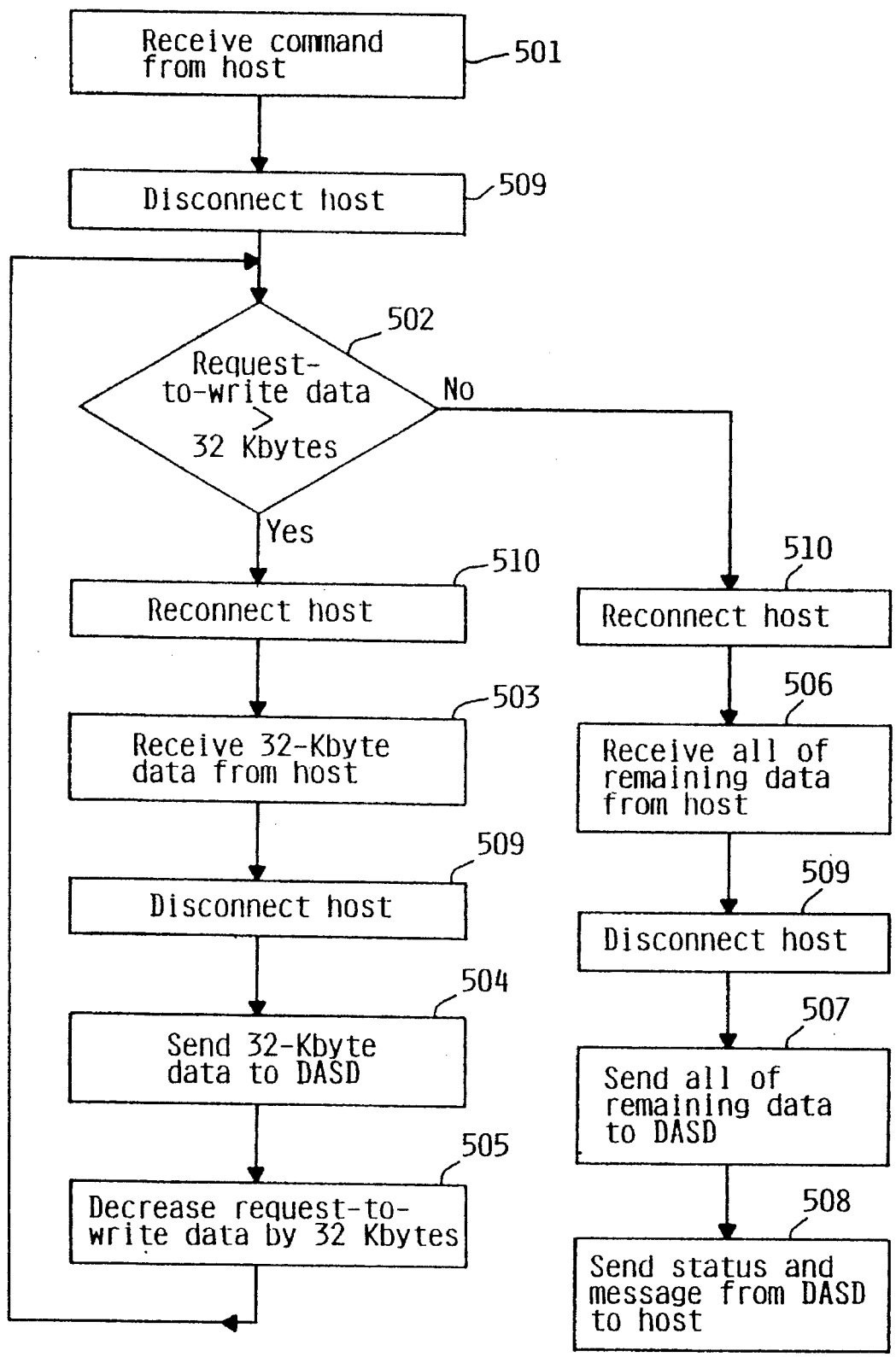
FIG. 5 is a flowchart showing the operation of the adapter for the redundant DASDs of the embodiment during a writing operation.

FIG. 4 shows data flow within adapter 101 during a writing operation to primary and secondary DASDs 107 and 108 from host computer 104. FIG. 5 shows the steps of the writing operation. In the writing operation, host computer 104 merely issues a command for writing to one of the DASDs.

A command from host computer 104 is received by host SCSI interface 201 (Step 501). A decision whether the size of data to be written from host 104 is greater than 32 Kbytes is made (Step 502), and if so, the data is divided into segments of 32 Kbytes and then transferred from host 104 to adapter 101 (Step 503). The data transferred to host SCSI interface 201 is temporarily stored in primary and secondary buffer memories 205 and 206 and then written, through primary and secondary device SCSI interfaces 202 and 203, to each of a pair of primary and secondary DASDs 107 and 108 which constitute disk storage devices, that is, the destination of the write command (Step 504). The same data is always stored in the same address in the pair of the DASDs. Then the total amount of data to be written is decreased by 32 Kbytes (Step 505) and a loop is initiated from its beginning to receive the next 32-Kbyte data from host 104.

If the amount of data transferred from host 104 is less than 32 Kbytes, all the data transferred from the host is received by the adapter (Step 506). The data transferred to host SCSI interface 201 is temporarily stored in primary and secondary buffer memories 205 and 206 and then written, through primary and secondary device SCSI interfaces 202 and 203, to each of the pair of primary and secondary DASDs 107 and 108 which constitute disk storage devices, that is, the destination of the write command (Step 507). Then, when the total amount of data is written, the status information and a message are sent from primary DASD 107 to host 104 (Step 508). It will be appreciated that if host 104 permits adapter 101 to be disconnected from host SCSI bus 102, adapter 101 may disconnect host SCSI bus 102 and connect it again during the operation of adapter 101, when the passing of data is necessary (Steps 509 and 510).

Since the above operations on adapter 101 are independently performed by the adapter itself, they are transparent to the side of host computer 104. This means that only a single writing operation is necessary for the operating system of host computer 104 and an application program running under the operating system. That is, a redundant DASD system prepared for failure can be built without any change to hardware and software on the sides of the host computer and the DASDs.

Figure 6:
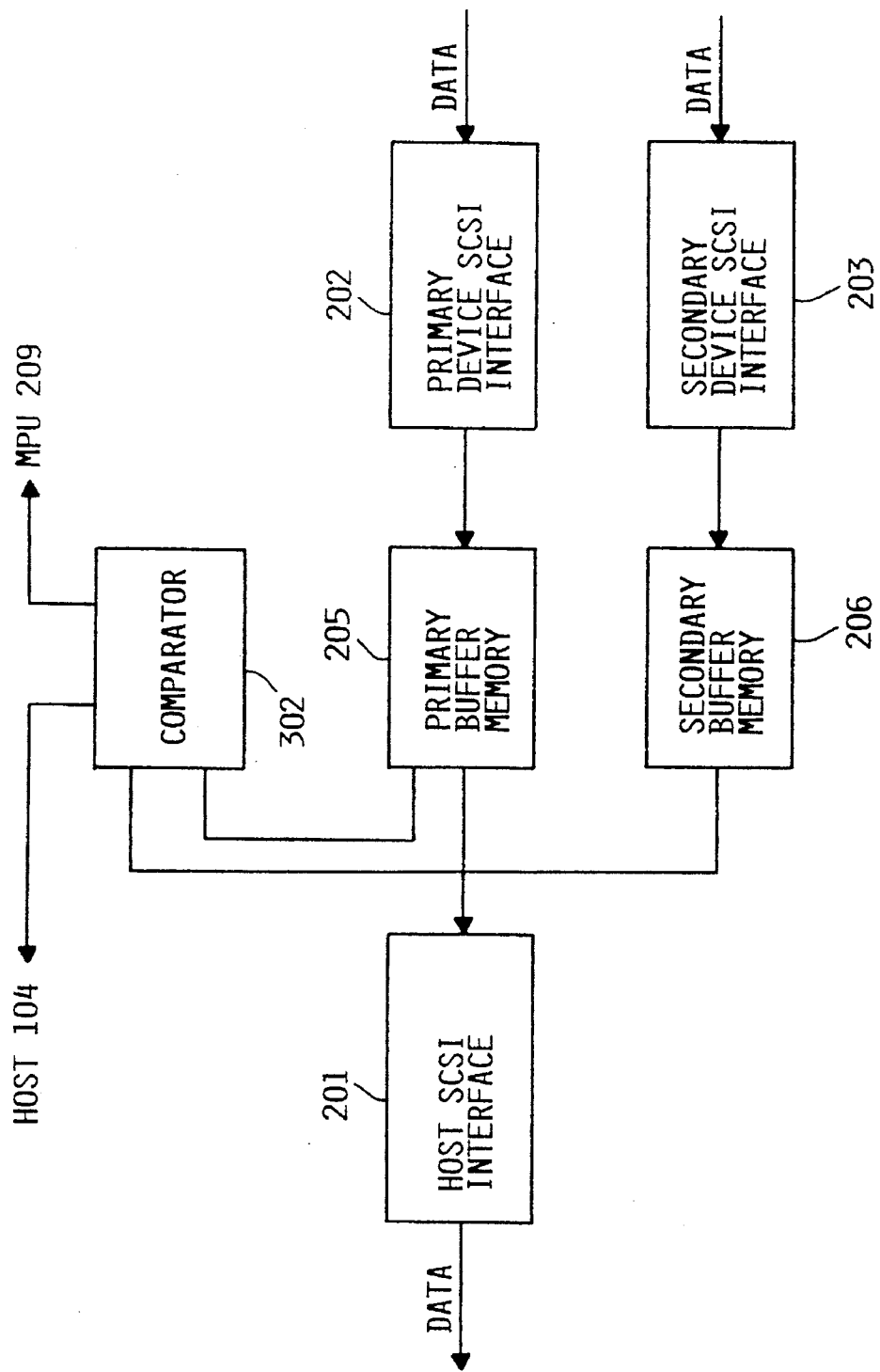
FIG. 6 is a block diagram showing data flow in the adapter for the redundant DASDs of the embodiment during a reading operation.
Figure 7:
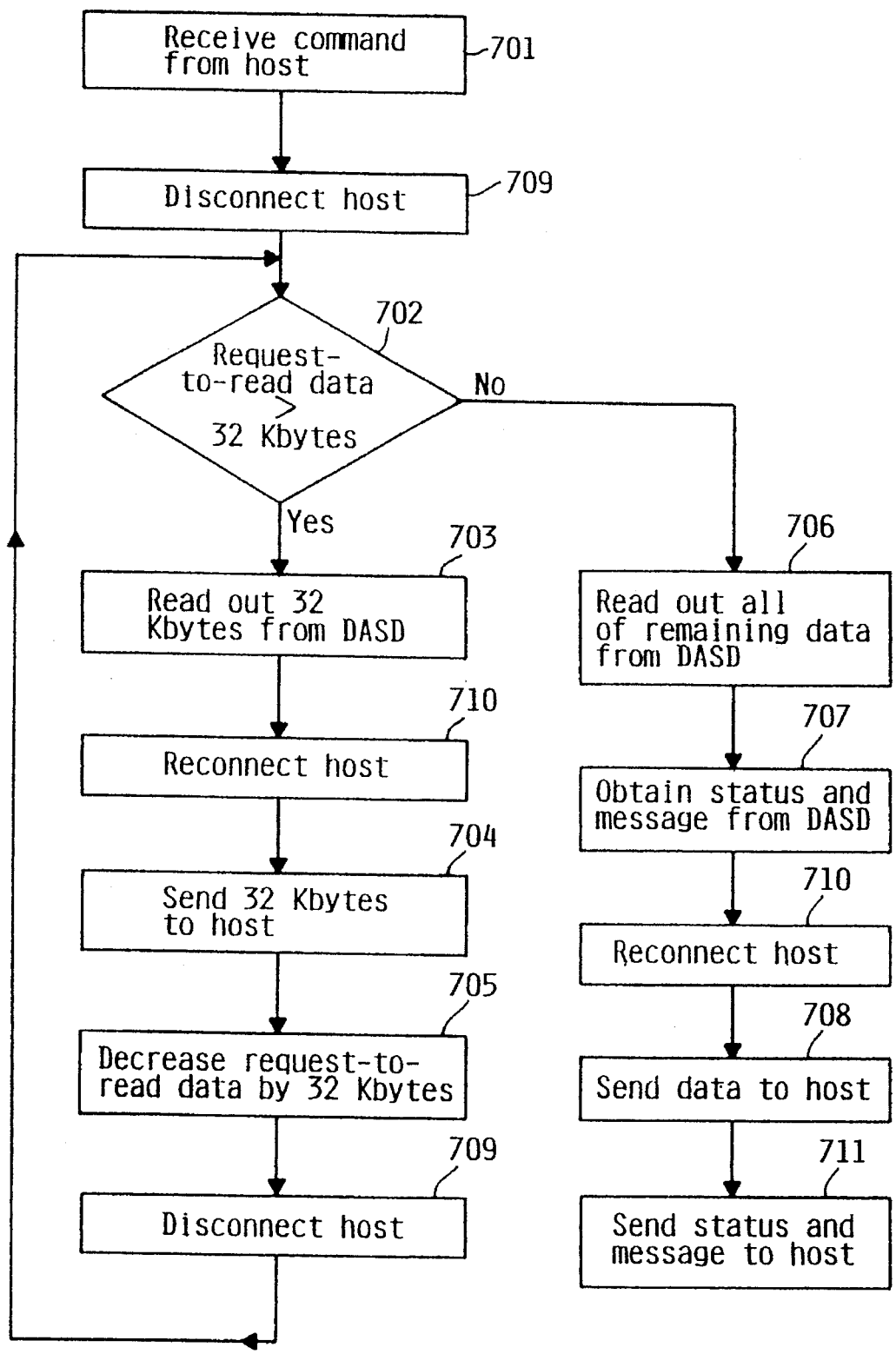
FIG. 7 is a flowchart showing the operation of the adapter for the redundant DASDs of the embodiment during a reading operation.

FIG. 6 shows the flow of data within adapter 101 when data is read from primary and secondary DASDs 107 and 108 and transferred to host computer 104, and FIG. 7 shows the steps of a reading operation. During the reading operation, host computer 104 issues a read command for only one of the DASDs.

The command from host computer 104 is received by host SCSI interface 201 (Step 701). A decision whether data read out from the DASDs is greater than 32 Kbytes is made (Step 702), and if so, the data is divided into segments for each 32 Kbytes and transferred from adapter 101 to host 104 (Step 703). The data read out from a pair of primary and secondary DASDs 107 and 108, which is the destination of the read command, is temporarily stored, through primary and secondary device SCSI interfaces 202 and 203, in primary and secondary buffer memories 205 and 206. Then, only data from primary DASD 107 is transferred from primary buffer memory 205 to host 104 through host SCSI interface 201 (Step 704). That is, data is always read out from a pair of DASDs 107 and 108, but only data read from primary DASD 107 is transferred to the host. The total amount of data to be read out is decreased by 32 Kbytes (Step 705) and a loop is then initiated from the beginning to receive the next 32-Kbyte data from primary and secondary DASDs 107 and 108.

If the amount of data read out is less than 32 Kbytes, the entire data is received from primary and secondary DASDs 107 and 108 (Step 707). Then status information and a message are received from primary and secondary DASDs 107 and 108 (Step 707). The data, status information, and message are temporarily stored in primary and secondary buffer memories 205 and 206 and then only data from primary buffer memory 205 is transferred, through host SCSI interface 201, to host 104 (Step 708). Then after all the data from primary buffer memory 205 is transferred, only the status information and message from primary DASD 107 are transferred to host 104 (Step 711). It will be appreciated that if host 104 permits adapter 101 to be disconnected from host SCSI bus 102, adapter 101 may disconnect host SCSI bus 102 and connect it again during the operation of adapter 101, only if the passing of data is necessary. (Steps 709 and 710).

Since the above operations of adapter 101 are performed independently by the adapter itself, they are transparent to the side of host computer 104. This means that only a single reading operation is necessary for the operating system of host computer 104 and an application program running under the operating system. That is, a redundant DASD system prepared for failure can be easily built without any change to hardware and software on the sides of the host computer and the DASDs. It will be appreciated also that data and status information from primary and secondary DASDs 107 and 108 may be compared by comparator 302 when they are transferred to primary and secondary buffer memories 205 and 206 and disaccord may be indicated, if any, to host 104 or MPU 209.

Figure 8:
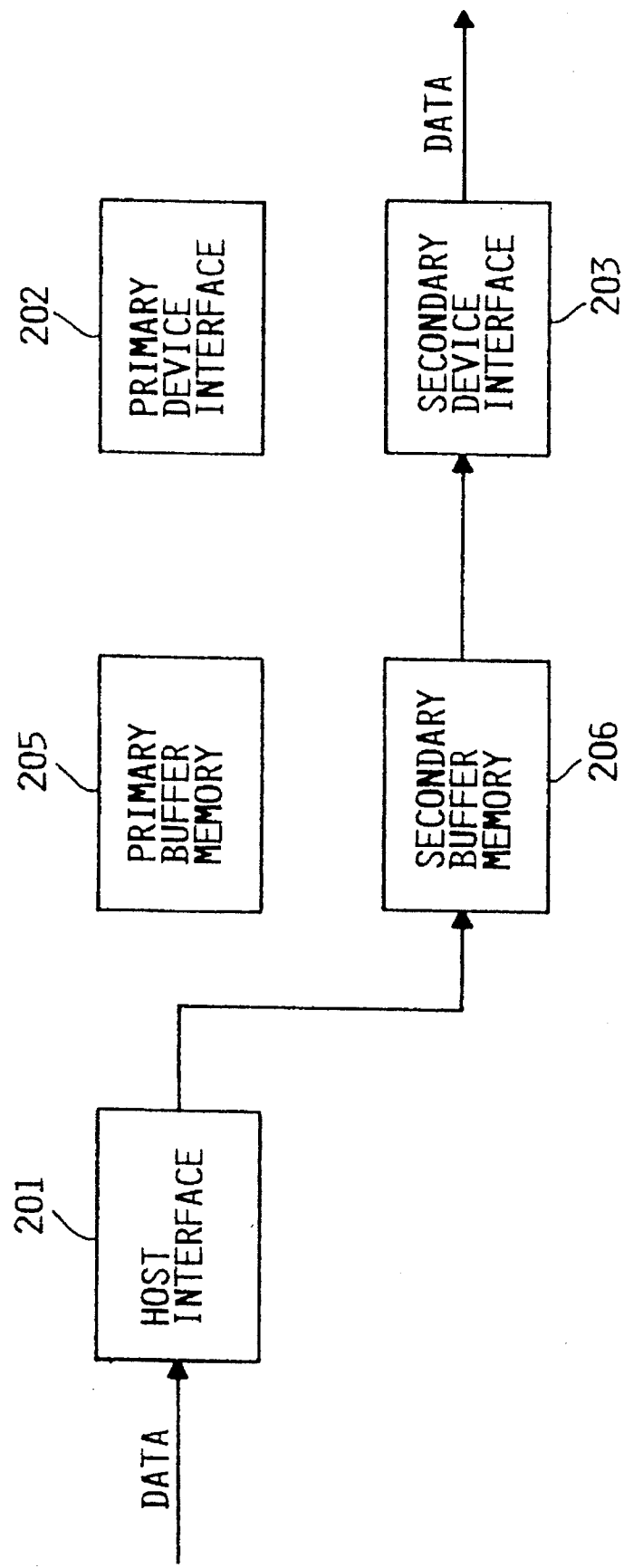
FIG. 8 is a block diagram showing data flow in the adapter for the redundant DASDs of the embodiment in the case where failure occurs in a primary DASD during a writing operation.
Figure 9:
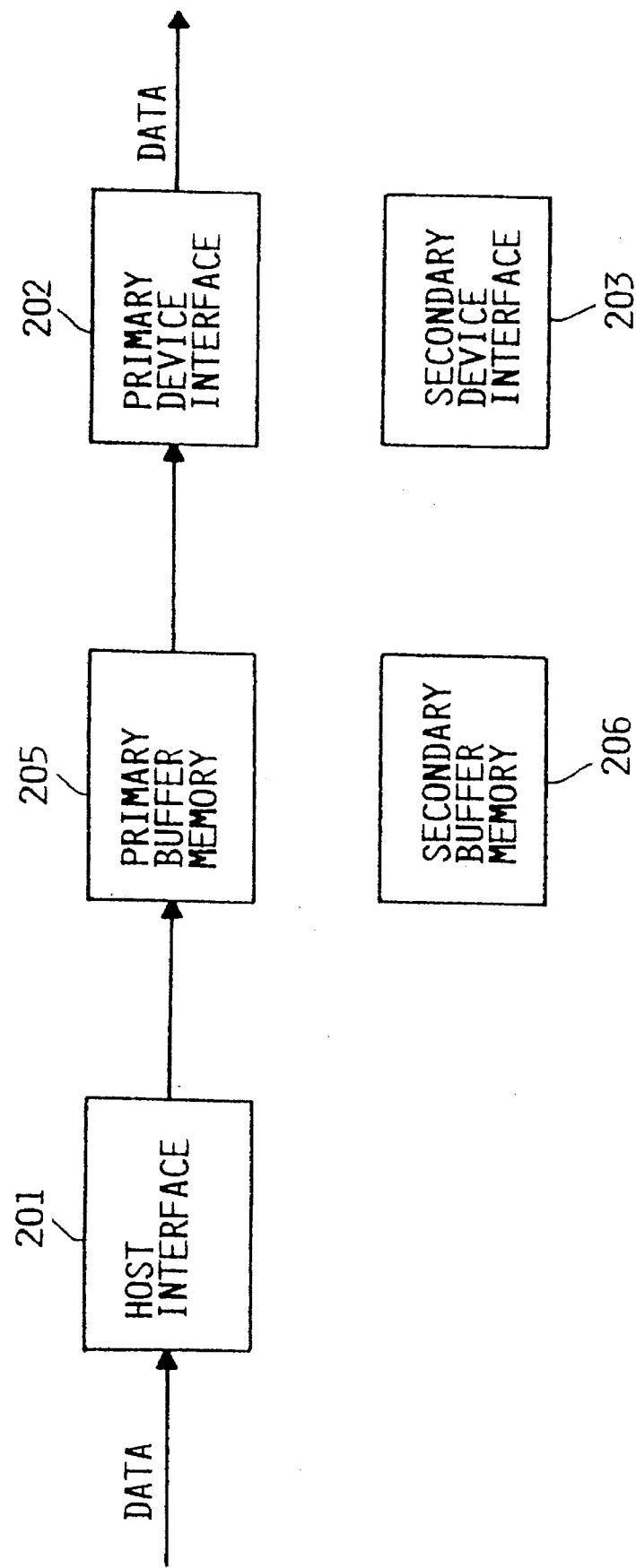
FIG. 9 is a block diagram showing data flow in the adapter for the redundant DASDs of the embodiment in the case where failure occurs in a secondary DASD during a writing operation.

In the following, the operations performed by adapter 101 when one of a pair of primary and secondary DASDs 107 and 108 fails during a writing operation by host computer 104 are described by reference to FIG. 8 and FIG. 9. First, when primary DASD 107 fails, it sends "Check condition" to adapter 101. Adapter 101 sends "Request sense" to primary DASD 107 and records sense data from primary DASD 107. Adapter 101 records a finally accessed logical block address (LBA) of primary DASD 107. Then, as shown in FIG. 8, adapter 101 closes a data path to primary buffer memory 205 and primary DASD 107, and then performs a writing operation for secondary buffer memory 206 and secondary DASD 108. At the completion of the writing operation for secondary DASD 108, adapter 101 notifies host computer 104 that the writing operation has been successfully completed. Then adapter 101 tries to recover the erroneous logical block address (LBA) of primary DASD 107 by using a reassign block command. The above-mentioned operations performed by adapter 101 are transparent to the host computer 104. That is, host computer 104 merely knows that the writing operation completed normally for the disk storage device.

Now operations in the case where primary DASD 107 normally functions and secondary DASD 108 fails are described by reference to FIG. 9. In this case, the same operations as primary DASD 107 fails, described by reference to FIG. 8 are performed, except that a data path to secondary DASD 108 is closed and a usual writing operation is performed for primary DASD 107.

If both DASDs fail, adapter 101 sends status information from the DASD in which failure occurred later to host computer 104. That is, the host computer recognizes failure based on the status of the DASD which failed last.

Figure 10:
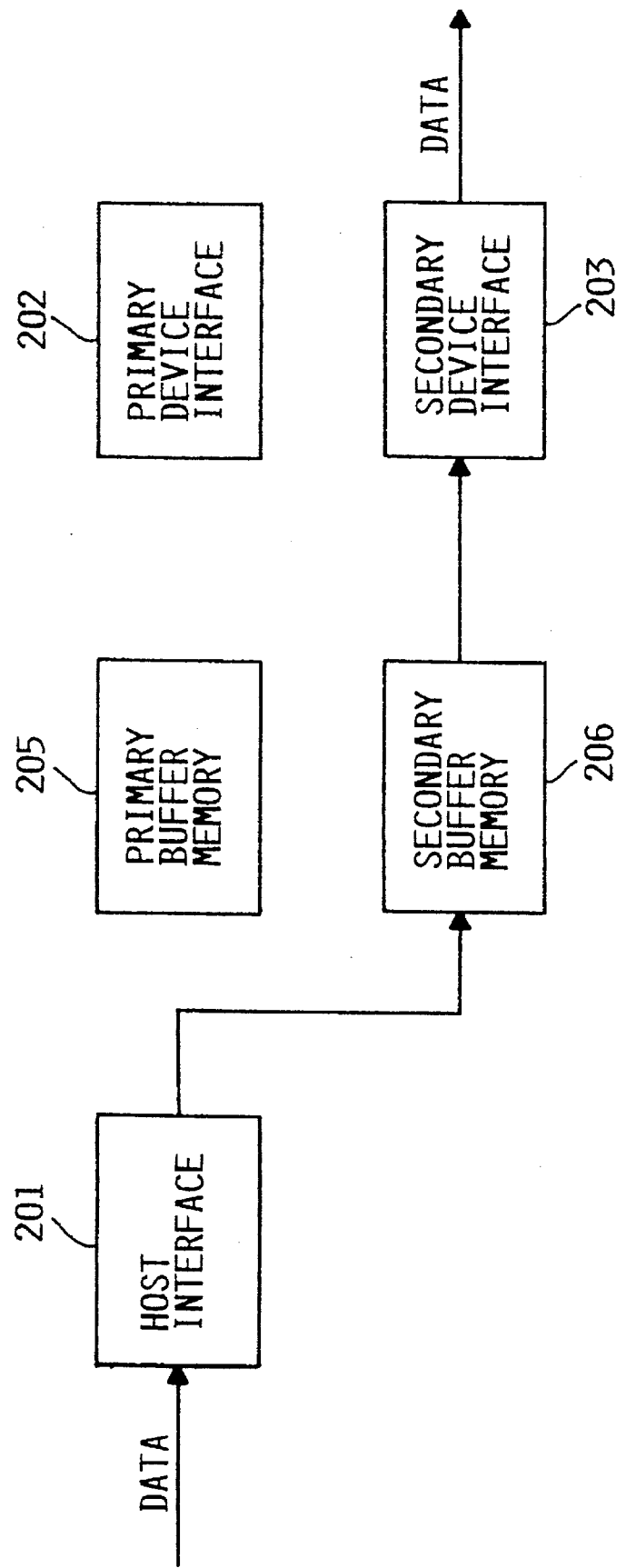
FIG. 10 is a block diagram showing data flow in the adapter for the redundant DASDs of the embodiment in the case where failure occurs in a primary DASD during a reading operation.

In the following, the operations of to be performed by adapter 101 when any one of a pair of primary and secondary DASDs 107 and 108 fails during a reading operation by host computer 104 are described by reference to FIG. 10 and FIG. 11. First, when primary DASD 107 fails, it sends "Check condition" to adapter 101. Adapter 101 sends "Request sense" to primary DASD 107 and records sense data from primary DASD 107. Adapter 101 records a finally accessed logical block address (LBA) of primary DASD 108. After the completion of a reading operation for secondary DASD 108, adapter 101 establishes a data path from secondary buffer memory 206 to host computer 104 and closes a path from primary buffer memory 205 and primary DASD 107, as shown in FIG. 10. At the time of completion of a read command for secondary DASD 108, adapter 101 notifies host computer 104 of reading successfully completed. Then adapter 101 tries again to read data from primary DASD 107. The above operations are transparent to host computer 104. That is, host computer 104 merely knows that the reading operations were completed normally for the disk storage devices.

Figure 11:
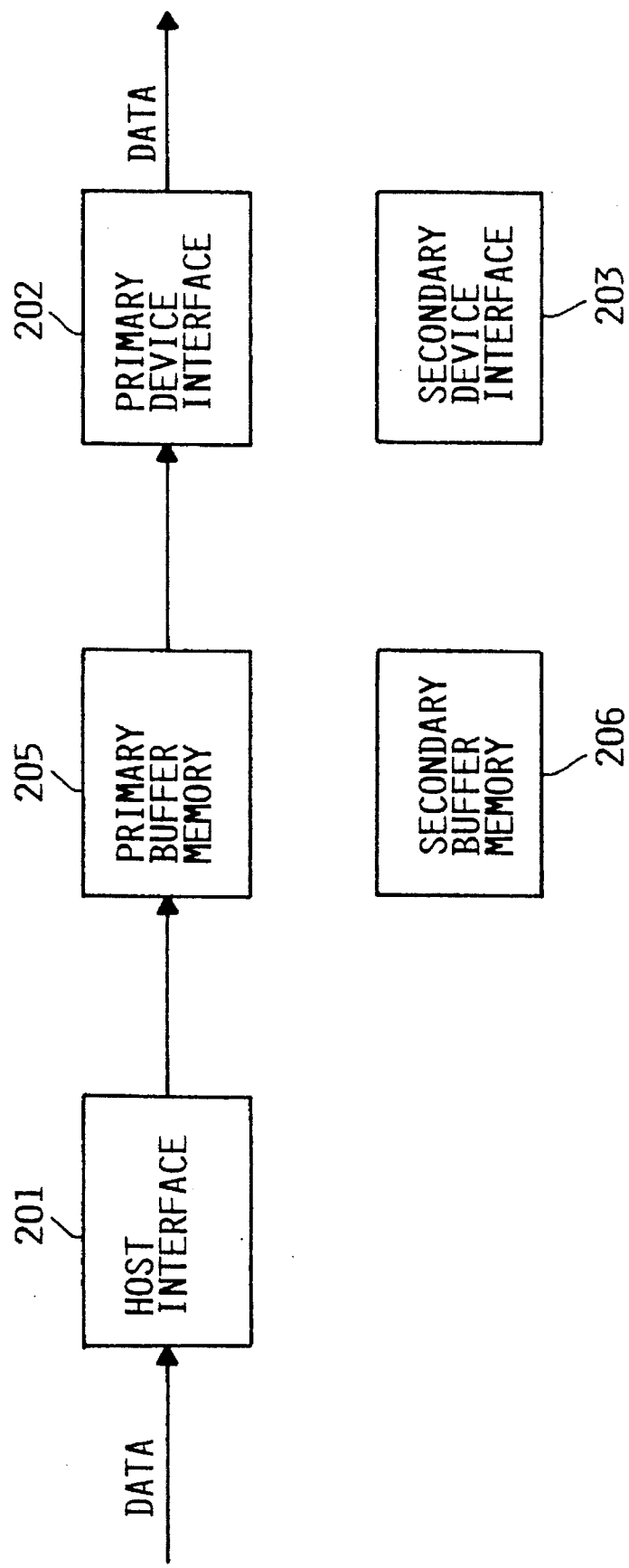
FIG. 11 is a block diagram showing data flow in the adapter for the redundant DASDs of the embodiment in the case where failure occurs in a secondary DASD during a reading operation.

As shown in FIG. 11, in the case where primary DASD 107 normally functions and secondary DASD 108 fails, the same operations as in FIG. 10 are performed, except that the path from secondary DASD 108 is closed and a reading operation is performed only for primary DASD 107.

If both DASDs fail, adapter 101 retries recovery from failure for either of them in which the failure occurred later, and if the recovery is not successful, transfers the status of the DASD in which the failure occurred later and data read out from the DASD to host computer 104. The host computer recognizes the failure based on the status of the DASD. If recovery from the failure is made in the retry, the reading operation continues and an attempt to recover the other DASD in which failure first occurred is made.

Adapter 101 performs a recovery operation for a pair of the primary and secondary DASDs under the following conditions: A logical block address (LBA) in either of the paired primary and secondary DASDs needs to be recovered, both the primary and secondary DASDs are available and one DASD contains valid data of the logical block address (LBA) which needs to be recovered in the other DASD, and a command requested by the host is not being executed by adapter 101.

Figure 12:
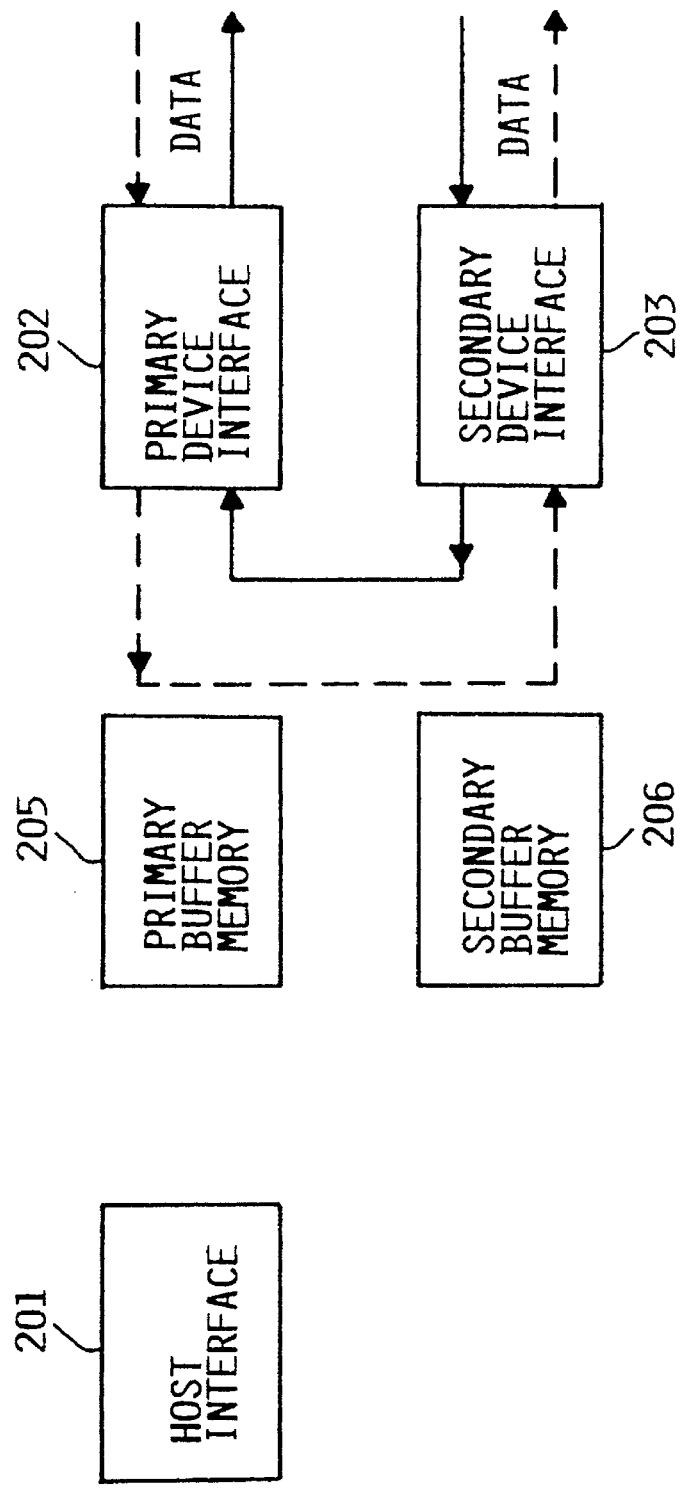
FIG. 12 is a block diagram showing data flow in the adapter for the redundant DASDs of the embodiment in the case of recovery for a redundant DASD system by transferring data from a sound DASD to a failed or new replacing DASD.

During the recovery operation, as indicated by solid and dotted lines in FIG. 12, a data path from primary DASD to secondary DASD or the secondary DASD to the primary DASD is formed according to which DASD failed. Then valid data is directly transferred from one DASD containing the data to the other DASD which needs to be recovered. During the recovery operation, adapter 101 accepts a command from host computer 101, but the command is executed after the completion of the recovery operation. The recovery operation is automatically performed by adapter 101 and transparent to host computer 104.

If the recovery is impossible, for example, one of the DASDs cannot be recovered because of its failure to function, adapter 101 informs the operator of the necessity of replacing the failed DASD by indication on panel 109. After the operator replaces the failed DASD with a new DASD, adapter 101 automatically rebuilds the DASDs into a redundant DASD system. That is, adapter 101 automatically formats the new DASD and copies data from the sound one of the paired DASDs. Adapter 101 copies the data to the new DASD without exerting influence on a reading or writing operation between host computer 104 and the sound DASD. Such replacement of the failed DASD and reconstruction of the new DASD are not influential in operations between the host computer and the sound DASD.

Figure 13:
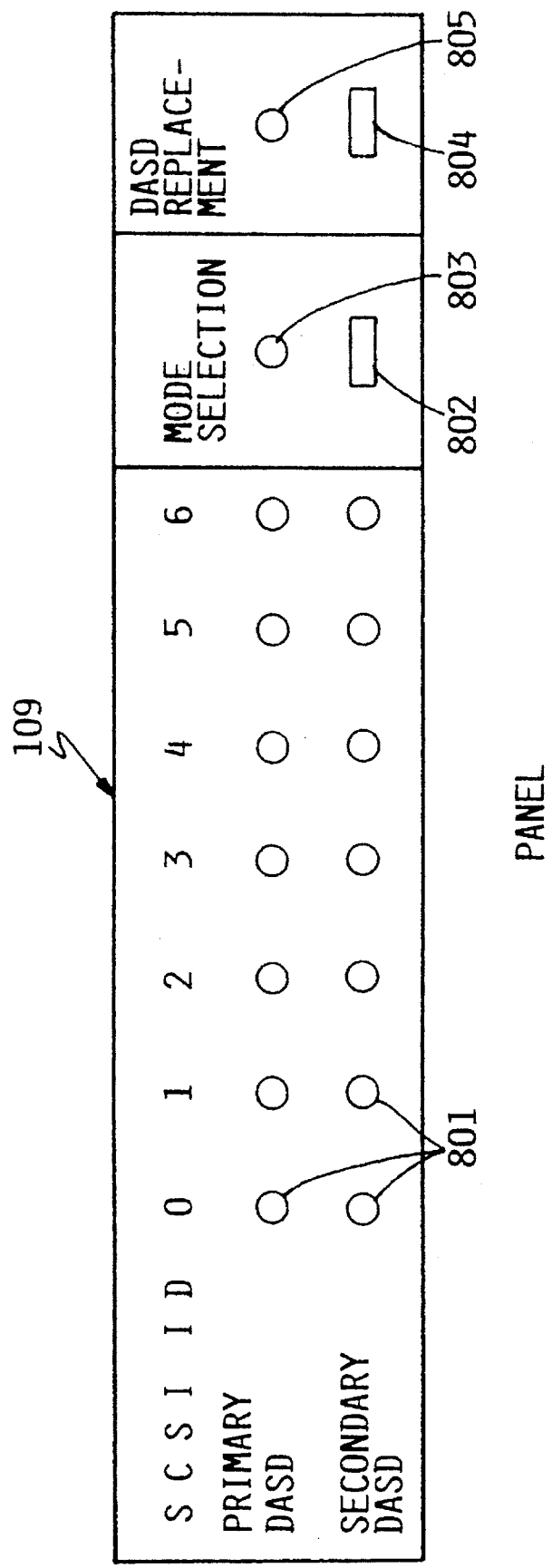
FIG. 13 is a front view of a panel for the adapter for the redundant DASDs of the embodiment.

FIG. 13 shows panel 109 used in the embodiment. Panel 109 provides fourteen light emitting diodes (LED) 801 each indicating status of a total of fourteen DASDs corresponding to IDs 0 to 6 in each of the SCSI interfaces connected to primary and secondary device SCSI buses 105 and 106, respectively. Further, panel 109 includes mode selector switch 802 for switching the adapter from normal operation mode to maintenance mode and light emitting diode 803 for indicating a state of the switch. Still further, panel 109 includes DASD selector switch 804 for switching one of the DASDs into a replaceable state and light emitting diode 805 for indicating the state. The relationship of the on or off state of each of LEDs 801, 803, and 804 to each state of adapter 101 and DASDs 107 and 108 is shown in FIG. 14.

When replacing the failed DASD, the operator sets on DASD selector switch 804 on panel 109 and waits until LED 805 comes on. After LED 805 comes on, the failed DASD is turned off, the DASD is replaced with a new DASD, and then new DASD is turned on. Finally, when DASD selector switch 804 is set off, adapter 101 rebuilds the DASDs into a redundant DASD system. That is, adapter 101 compares serial numbers of DASDs 107 and 108 stored in EEPROM 211 to determine which DASD has been replaced, formats the new DASD by issuing a disk format command, fetches data from the sound DASD paired with the replaced DASD, and copies the data to the new DASD. As described above, failure can be detected in one of the DASDs, a failed DASD can be replaced, and a redundant DASD system can be rebuilt independently of host computer 104, that is, without stopping the running of host computer 104.

FIG. 15 shows SCSI commands used for adapter 101 of the embodiment, host computer 104, and DASDs 107 and 108. Host computer 104 handles DASDs 107 and 108 controlled by adapter 101 as logical units. To keep the same contents in each of a pair of DASDs 107 and 108, all of the commands sent from host computer 104 are first recognized by adapter 101. According to the type of command, adapter 101 handles the commands differently from one another. The commands are usually processed as follows. First, adapter 101 sends a command to a pair of DASDs 107 and 108. Adapter 101 returns a response from DASDs 107 108 to host computer 104 if an active DASD (the primary DASD or a sound DASD if only one of the pair of the DASDs exists as the sound DASD) responds with "Good" or "Intermediate Good".

If the active DASD responds with "Busy", adapter 101 again sends the same command to the active DASD after a certain time elapses. If the active DASD responds with "Check condition" or some other unexpected status, adapter 101 assumes the response to be an error, switches the standing-by DASD (usually secondary DASD 108 paired with primary DASD 107) to active, and sends the same command to the DASD. Then a response from the DASD which became active is sent to host computer 104, as it is. If the standing-by DASD does not exist, a response from the first active DASD is sent to host computer 104, as it is.

In FIG. 15, with respect to commands indicated by A on the right side, that is, read-out commands, adapter 101 sends them to both of paired DASDs 107 and 108. A data path is usually switched so that data can be transferred from primary DASD 107 to host computer 104. If an error occurred in primary DASD 107 during a reading operation, the data path is switched to the side of secondary DASD 108, which did not cause the error, without notifying host computer 104. Error recovery in primary DASD 107 is made after the completion of the reading operation. If an error occurred also in secondary DASD 108, the command is retried to secondary DASD 108. If the error persists, the execution of the command stops and the error state for secondary DASD 108 is sent to host computer 104. If an error occurs during the execution of a read command in the case that only one DASD is available, adapter 101 retries the command. If the error persists, the execution of the command stops and the status of the only one DASD is sent to the host computer.

In FIG. 15, with respect to commands indicated by B on the right side, that is, write commands, adapter 101 performs much the same operations as in the read commands indicated by A, but does not retry them. That is, adapter 101 tries a write command for both of paired DASDs 107 and 108. If an error occurs in one DASD, the command is executed, without notifying the host computer, for the other DASD. After the completion of execution, adapter 101 makes error recovery. If an error occurs also in the other DASD, the execution of the write command stops and the status of the other DASD is sent to host computer 104. If an error occurs during the execution of a write command in the case that only one DASD is available, the execution of the command stops and the status of the single DASD is sent to host computer 104.

In FIG. 15, a command indicated by C on the right side, that is, a maintenance switch command (02h) is called a vendor unique command, that is, one of the SCSI commands which is given special meaning at the discretion of a designer. The maintenance switch command, which is a characteristic of the present invention, is described in detail by reference to FIG. 16 in the following. Adapter 101 performs the following operations with respect to the maintenance switch command. If a XFER bit is 0 and MA_MODE is X00 (X may be any bit value), a pair of DASDs 107 and 108 perform a redundant DASD system function in usual operating mode. If MA_MODE is some other than X00, the redundant DASD system function for paired DASDs 107 and 108 stops and host computer 104 can have access to each of the paired DASDs. If the XFER bit is 1, a recovery table and an error log stored in nonvolatile memory EEPROM 211 of adapter 101 can be dumped.

If the XFER bit is 0, MA_MADE determines the grouping of DASDs 107 and 108. If MA_MADE is X00, as described above, the redundant DASD system function is performed, as shown in FIG. 17, primary and secondary DASDs 107 and 108 connected to primary and secondary SCSI buses 105 and 106, respectively and having the same identification code in each of the SCSI device interfaces, are paired with each other and the paired DASDs function on the host computer as if they are a DASD corresponding to the same logical unit number. This is a usual operating mode, and a default mode after resetting.

If mode selector switch 802 is set on panel 109, a value for MA_MODE can be changed from X00 to another, that is, adapter 101 can be changed from the usual operating mode in which the redundant DASD system function is performed to maintenance mode in which host computer 104 can have access to each of paired DASDs 107 and 108. That is, as shown in FIG. 18, when the XFER bit is 0, and MA_MODE is X01, the redundant DASD system function is released and DASDs having ID=4, 5, 6 in DASDs 107 and 108 connected to primary and secondary SCSI buses 105 and 106, respectively are given unique logical unit numbers and individually accessed by host computer 104. As shown in FIG. 19, when the XFER bit is 0, and MA_MODE is X10, the redundant function is released and DASDs having ID=1, 2, 3 in DASDs 107 and 108 connected to primary and secondary SCSI buses 105 and 106, respectively, are given unique logical unit numbers and individually accessed by host computer 104. As shown in FIG. 20, when the XFER bit is 0, and MA_MODE is X11, the redundant function is released and DASDs having ID=0 in DASDs 107 and 108 connected to primary and secondary SCSI buses 105 and 106, respectively, are given unique logical unit numbers and individually accessed by host computer 104. In the figures, DASDs indicated by N/A cannot be accessed by host 104.

As described above, each of DASDs 107 and 108 connected to adapter 101 can be accessed by host computer 104 for the purposes of test, etc. Instead of manually setting on mode selector switch 802 on panel 109, software, for example, a program stored in a medium called a reference diskette may run on host computer 104 to release the redundant DASD system and have access to each of DASDs 107 and 108, as described above, based only on operations by host computer 104. However, in this case, it is necessary to take care of the integrity of data in a pair of DASDs 107 and 108 in an unexpected situation.

According to an adapter of the present invention for building up a redundant DASD system, since the adapter itself performs a redundant DASD system function and an interface to a host computer and interfaces to DASDs have the same interface design, the existence of the adapter is transparent to an operating system or an application program running on the host, and the DASDs connected to the adapter. Therefore, any change is not needed to the operating system and the application program on the side of host and the DASDs. According to the present invention, a redundant DASD system prepared for failure can be easily built without any change to the host computer, the operating system and the application program running on the host computer, or the DASDs. Further, according to the adapter of the present invention, since the adapter itself has a function for detecting failure in the DASDs, replacing a failed DASD, and rebuilding a redundant DASD system, the replacement of failed DASD, formatting for a new DASD, and rebuilding into redundant DASD system become possible without the intervention of the host computer, that is, without stopping jobs on the host. For the purposes of test, etc., each of the DASDs can be accessed, if necessary, which is advantageous to the maintenance of each DASD.

What is claimed is:

1. An adapter which is connected between a host computer and disk storage devices for constructing a redundant disk storage system, comprising:

a host interface for connecting to the host computer, a primary device interface and a secondary device interface, each having the same interface design as said host interface, for connecting to a plurality of primary disk storage devices and a plurality of secondary disk storage devices, respectively, each of said disk storage devices being identified by a unique identification code in each of said primary and secondary device interfaces;

means for detecting failure of each of said primary and secondary disk storage devices based on information from said devices; and control means for making a pair of said primary and secondary disk storage devices have the same identification code in each of said primary and secondary device interfaces, and when said pair of said primary and secondary disk storage devices are in normal operation, writing identical information from said host computer into said pair of said primary and secondary disk storage devices and reading out information from said primary disk storage device of said pair and sending it to said host computer, and when a failure occurs in one of said pair of said primary and secondary disk storage devices, reading or writing information only from or to the non-failed disk storage device of said pair of disk storage devices.

2. The adapter according to claim 1, said means for detecting failure also including means for, when said means for detecting a failure detects a failure in one of said pair of said disk storage devices, indicating the disk storage device where the failure occurs, independently of said host computer and means for enabling the failed disk storage device to be replaced independently of the running of said host computer and placing a new disk storage device into the redundant disk storage system by using the non-failed disk storage device from said pair of disk storage devices.

3. The adapter according to claim 1, further comprising means for enabling said host computer to have access to each of said paired disk storage devices by using a command from said host computer and giving a unique logical unit number to each of said pair of the disk storage devices.

4. The adapter according to claim 1, further comprising means for copying from the non-failed disk storage device of said paired disk storage devices having normal data to the failed disk storage device of said paired disk storage devices not having normal data.

5. The adapter according to claim 1, wherein said means for detecting a failure includes means for comparing information from said paired disk storage devices with each other during the operation of said host computer to monitor the accordance of information.

6. The adapter according to claim 1, wherein said host interface, said primary device interface, and said secondary device interface are SCSI interfaces.

7. An adapter which is connected between a host computer and disk storage devices for constructing a redundant disk storage system, comprising:

a host SCSI interface for connecting to a host SCSI bus connected to the host computer;

a primary device SCSI interface for connecting to a primary SCSI bus connected to a plurality of primary disk storage devices, each of said primary disk storage devices being identified by a unique identification code in said primary device SCSI interface;

a secondary device SCSI interface for connecting to a secondary SCSI bus connected to a plurality of secondary disk storage devices, each of said secondary disk storage devices being identified by a unique identification code in said secondary device SCSI interface;

failure detecting means for detecting failure of each of said primary and secondary disk storage devices based on information from said devices; and control means for making a pair of said primary and secondary disk storage devices have the same identification code in each of said primary and secondary device SCSI interfaces, and when no failure of said pair of said devices is detected by said failure detecting means, writing identical information from said host computer into said pair of devices and reading out information form said primary disk storage device of said pair and sending it to said host computer, and when a failure of one of said disk storage devices of said pair is detected by said failure detecting means, reading or writing information only from or to the non-failed disk storage device of said pair.

\* \* \* \* \*